(12) United States Patent
Ogawa et al.

(10) Patent No.: US 10,614,991 B2
(45) Date of Patent: Apr. 7, 2020

(54) ELECTRON BEAM APPARATUS COMPRISING MONOCHROMATOR

(71) Applicant: KOREA RESEARCH INSTITUTE OF STANDARDS AND SCIENCE, Daejeon (KR)

(72) Inventors: Takashi Ogawa, Daejeon (KR); Ju Hwang Kim, Daejeon (KR)

(73) Assignee: KOREA RESEARCH INSTITUTE OF STANDARDS AND SCIENCE, Daejeon (KR)

(*) Notice: Subject to any disclaimer, the term of this patent is extended or adjusted under 35 U.S.C. 154(b) by 177 days.

(21) Appl. No.: 15/527,588

(22) PCT Filed: May 20, 2016

(86) PCT No.: PCT/KR2016/005350
§ 371 (c)(1),
(2) Date: May 17, 2017

(87) PCT Pub. No.: WO2017/200124
PCT Pub. Date: Nov. 23, 2017

(65) Prior Publication Data
US 2019/0154502 A1    May 23, 2019

(30) Foreign Application Priority Data
May 20, 2016 (KR) .................. 10-2016-0061839

(51) Int. Cl.
*H01J 37/05* (2006.01)
*G01N 23/2251* (2018.01)
(Continued)

(52) U.S. Cl.
CPC .......... *H01J 37/05* (2013.01); *G01N 23/2251* (2013.01); *H01J 37/26* (2013.01);
(Continued)

(58) Field of Classification Search
CPC .. H01J 37/05; H01J 37/28; H01J 37/26; H01J 2237/0458; H01J 37/3053; H01J 2237/0453
See application file for complete search history.

(56) References Cited

U.S. PATENT DOCUMENTS 4,812,652 A * 3/1989 Egle ................ H01J 37/05
                                               250/305
6,670,611 B1 * 12/2003 Kruit ................ H01J 37/05
                                               250/288

(Continued)

FOREIGN PATENT DOCUMENTS

KR    10-1633978 B1    6/2016

*Primary Examiner* — Wyatt A Stoffa
(74) *Attorney, Agent, or Firm* — Knobbe Martens Olson & Bear LLP

(57) ABSTRACT

The present invention relates to an electron beam apparatus including a monochromator in which cylindrical electrostatic lenses for deflecting a path of an electron beam in the lenses are arranged symmetrically and an aperture including a plurality of selectable slits is disposed therebetween to be able to select an electron beam having a specified energy range. The electron beam apparatus has a monochromator having high resolution and excellent stability and maintainability by disposing slits and circular openings in one aperture part in parallel arrangement, thereby improving spatial resolution and energy resolution.

15 Claims, 12 Drawing Sheets

(51) Int. Cl.
*H01J 37/26* (2006.01)
*H01J 37/28* (2006.01)

(52) U.S. Cl.
CPC ....... *H01J 37/28* (2013.01); *H01J 2237/0453* (2013.01); *H01J 2237/2802* (2013.01)

(56) References Cited

U.S. PATENT DOCUMENTS

| | | | |
|---|---|---|---|
| 8,853,616 B2* | 10/2014 | Mukai | H01J 37/023 250/252.1 |
| 9,111,715 B2* | 8/2015 | Parker | H01J 37/05 |
| 10,037,866 B2* | 7/2018 | Enyama | H01J 37/222 |
| 2001/0052744 A1* | 12/2001 | Tsuno | H01J 37/05 313/364 |
| 2007/0069150 A1* | 3/2007 | Frosien | H01J 37/05 250/396 ML |
| 2007/0125954 A1* | 6/2007 | Frosien | H01J 9/18 250/396 R |
| 2009/0218506 A1* | 9/2009 | Nakasuji | H01J 37/05 250/396 ML |
| 2012/0318978 A1* | 12/2012 | Ren | H01J 37/05 250/310 |
| 2013/0248699 A1* | 9/2013 | Mukai | H01J 37/023 250/252.1 |
| 2015/0060666 A1* | 3/2015 | Hatakeyama | H01J 37/244 250/307 |
| 2015/0371811 A1* | 12/2015 | Ogawa | H01J 37/12 250/305 |
| 2016/0079030 A1* | 3/2016 | Mukai | H01J 37/05 250/305 |
| 2016/0111247 A1* | 4/2016 | Potocek | H01J 37/21 250/307 |
| 2017/0221673 A1* | 8/2017 | Sed'a | H01J 37/28 |
| 2018/0114672 A1* | 4/2018 | Ogawa | H01J 29/62 |

* cited by examiner

ELECTRON BEAM APPARATUS COMPRISING MONOCHROMATOR

TECHNICAL FIELD

The present invention relates to an electron beam apparatus including a monochromator, and more particularly, to an electron beam apparatus including a monochromator in which cylindrical electrostatic lenses for deflecting a path of an electron beam in the lenses are arranged symmetrically and an aperture including a plurality of selectable slits is disposed therebetween to be able to select an electron beam having a specified energy range.

Background Art

Moving electrons may change their paths by an electrostatic field or a magnetic field, thus an electron path control apparatus that serves to control a propagation direction of an electron beam in which several electrons move together, or focus or disperse the electron beam, is called an electro-optical system, which refers to an optical system for controlling a path of light.

The electron beam is obtained from a cathode and is usually obtained from a Schottky electron source or a cold field emission electron source in which a surface of tungsten (W) is coated with zirconia oxide (ZrO). In such an electron beam, there are electrons which deviate from a predetermined energy range that electrons forming the beam typically have, and in the electro-optical system adjusted based on the predetermined energy range, the path of the electrons deviates from the set path range, which is a cause of increasing a beam diameter.

A monochromator selecting a particle of a specified energy range in the electron beam and removing a particle having energy out of the range, includes a Wien filter monochromator using an electric field and a magnetic field together, an electrostatic field monochromator making the electron beam to perform a circular movement in an electrostatic field generated by a circular lens, and a Mollenstedt energy analyzer monochromator in which propagating electron beam is incident on an asymmetric electrostatic field to move a path, or the like.

Here, a center of the cylindrical lens is provided with a plurality of electrodes having a rectangular opening and thus a high voltage for decelerating electrons is applied to a center electrode, and the cylindrical lens is an electron lens that makes two electrodes at both front and rear sides of the cylindrical lens have the same voltage, in which an insulating material is provided between the plurality of electrodes. In this way, the electron energy in the vicinity of the center electrode to which the high voltage is applied is reduced to approximately 0, a component passing through an outside of an optical axis of the lens is selected, and energy of charged particles is analyzed using energy dispersion occurring chromatic aberration of a lens axis. The monochromator that filters out components off a central axis of the electron source using an energy aperture and passes the components through the outside of the central axis of the electrostatic lens to provide energy spectrum to thereby selecting only a central energy part may be used for an electron beam apparatus like a scanning electron microscope (SEM). The monochromator reduces the effect of the chromatic aberration of the electron beam, thereby improving image resolution.

Korean Patent Laid-Open Publication No. 10-2015-0146079 relates to a monochromator and an electron beam apparatus including the same, which discloses a technology for a monochromator configured to include two electrostatic lenses each including a plurality of electrodes and an energy aperture disposed therebetween. However, the above patent has a problem in that an aperture needs to be replaced in order to use a general optical system and a beam current is reduced and instable due to contamination caused by a passage of an electron beam since a slit having a narrow width needs to be used to increase energy resolution.

RELATED ART DOCUMENT

Patent Document

Korean Patent Laid-Open Publication No. 10-2015-0146079

DISCLOSURE

Technical Problem

The present invention has been suggested to solve the above problems according to the related art, and an object of the present invention is to provide an electron beam apparatus including a monochromator capable of converting the monochromator into a general optical system only by a position movement that changes a position through which the electron beam passes from a slit to an opening while leaving an aperture, by installing a circular opening on a surface of the aperture on which the slit is formed and capable of stabilizing a beam current by selecting other slits only by the position movement of the slit on the aperture even when a beam current is decreased and instable due to contamination caused by a passage of the electron beam, by forming a plurality of slits having the same or different size on the aperture.

Technical Solution

In one general aspect, there is provided an electron beam apparatus including a monochromator, including: an electron source, the monochromator limiting energy of an electron beam emitted from the electron source to a predetermined range, a lens system, and a detector, wherein the monochromator may include: an aperture part that includes a plurality of rectangular energy selection slits, a plurality of dummy slits, and a plurality of circular slits; and a position adjustment part for adjusting a position movement of an aperture to change the slits.

The monochromator may include: a first electrode part that is configured of a plurality of electrodes forming a plane xy perpendicular to an incident direction z of the electron beam, with the plurality of electrodes including a rectangular opening parallel to the incident direction z, and is configured so that electrons incident along a central axis $x_0y_0$ of the incident direction z, by an effect of an electrostatic lens with an electric field formed by the rectangular opening when a voltage is applied to the electrode, are deflected to different positions according to an energy distribution in a direction x of a short side of the rectangular opening of the electrodes, and are propagated in parallel to the incident direction; an aperture part that includes a plurality of rectangular energy selection slits having the short side $S_x$ in the direction x, which is consistent with a deflected direction, so as to selectively pass particles of the deflected and propagated electron beam belonging to a predetermined energy range E, E+ΔE therethrough at a predetermined deflection position range x, x+$S_x$, a plurality of dummy slits for selecting a position, and a plurality of circular slits; and a position adjustment part for adjusting a position of the slits according to energy of the deflected and propagated electron beam.

The slits of the aperture part may be formed in thin film layers having a metal thin film that are formed on an upper surface and a lower surface of the central layer, a material of the central layer may be silicon nitride ($Si_3N_4$), carbon (C), platinum iridium (PtIr), and molybdenum (Mo) and a thickness thereof may range from 20 nm to 500 μm, a material of the metal thin film may be platinum (Pt) or gold (Au) and a thickness thereof may range from 10 to 200 nm, a diameter of the circular slit may range from 10 nm to 500 μm, and a length of the short side $S_x$ of the rectangular energy selection slit may range from 50 nm to 100 μm and a length of the long side $S_y$ thereof may range from 100 nm to 1000 μm.

The aperture part may include: a holder for supporting the thin film layer; a support for connecting the holder to the position adjustment part; and a base for fixing the position adjustment part to the aperture part attaching device, and the position adjustment part may move the slit in the deflected direction x or the perpendicular direction y to the deflected direction.

Each connection surface of the holder, the support, the position adjustment part, and the base may have an angular range within 1° with respect to the long side direction of the rectangular hole of the first electrode part.

The plurality of rectangular energy selection slits may have the same size or different sizes and may be arranged to be spaced apart from each other at a predetermined interval $L_y$ in the direction y of the long side $S_y$ orthogonal to the direction x of the short side $S_x$ that is the direction in which the electron beam is deflected.

The predetermined interval $L_y$ at which the plurality of rectangular energy selection slits are arranged along the direction y of the long side $S_y$ orthogonal to the direction x may be set to be larger than the diameter of the opening of the entrance aperture through which the electron beam is incident on a central axis $x_0y_0$ so that a current distribution of the electron beam incident on the first electrode part is limited to a predetermined size.

The plurality of circular slits may have the same size or different sizes and the plurality of circular slits may be arranged in parallel to be spaced apart from each other by a predetermined distance $M_x$ in the direction x of the short side $S_x$, which is the deflected direction, from the plurality of rectangular slits.

The plurality of circular slits may be arranged at a position coinciding with the central axis $x_0$ in the incident direction.

When the monochromator is not limited to the energy range E, E+ΔE, the electron beam apparatus may make the voltage applied to the first electrode part OFF to straighten the electron beam without deflecting the electron beam, and therefore the electron beam may be irradiated to a sample using one of the plurality of circular slits that are placed at the position coinciding with the extending line of the central axis $x_0$ of the incident direction.

The plurality of rectangular energy selection slits may have the same size and may be arranged at the predetermined intervals $L_x$ and $L_y$ along the direction x of the short side $S_x$ that is the direction in which the electron beam is deflected and the direction y orthogonal to the deflected direction and the predetermined interval $L_y$ at which the plurality of rectangular energy selection slits are arranged along the orthogonal direction y may be larger than the diameter of the opening of the entrance aperture through which the electron beam is incident on the central axis $x_0y_0$ so that the current distribution of the incident electron beam is limited to the predetermined size.

The plurality of rectangular energy selection slits may include the same size and different sizes, and the plurality of slits having the same size may be arranged at the predetermined interval $L_x$ along the direction x of the short side $S_x$ that is the direction in which the electron beam is deflected, the plurality of slits having different sizes may be arranged at the predetermined interval $L_y$ along the direction y orthogonal to the deflected direction x, and the predetermined interval $L_y$ at which the plurality of rectangular energy selection slits are arranged along the orthogonal direction y may be larger than the diameter of the opening of the entrance aperture through which the electron beam is incident on the central axis $x_0y_0$ so that the current distribution of the incident electron beam is limited to the predetermined size.

The number of dummy slits may be two and the dummy slits may be positioned, one by one, at each of both edges of the direction y orthogonal to the direction x of the short side $S_x$ that is the deflected direction from the central position of the direction x of the short side $S_x$.

The plurality of circular slits may be the same size or different sizes, and the circular slits may be arranged along the direction y orthogonal to the direction x of the short side $S_x$ that is the deflected direction or may be arranged at both edges of the orthogonal direction y.

When the monochromator according to the present invention is not limited to the energy range E, E+ΔE, the electron beam apparatus may make the voltage applied to the first electrode part OFF to straighten the electron beam without deflecting the electron beam, and therefore the electron beam may be irradiated to the sample using one of the plurality of circular slits that are placed at a position coinciding with the extending line of the central axis $x_0$ of the incident direction.

The direction of the long side of the rectangular energy selection slit may be aligned so that an angle range deviating from the direction of the long side of the rectangular opening of the first electrode part is within 1°.

The electron beam apparatus may include a second electrode part that is disposed at a rear end of the aperture part and generate an electric field to deflect the electron beam passing through the energy selection slit to the central axis $x_0y_0$ of the incident direction Z that is the original position at the entrance of the monochromator when a voltage is applied to the second electrode part configured of a plurality of electrodes including the opening formed in parallel to the incident direction z of the electron beam passing through the energy selection slit and a position of the second electrode part may be symmetrical to the first electrode part with respect to the aperture.

In another general aspect, there is provided an electron energy loss spectroscopy (EELS) using the monochromator.

In another general aspect, there is provided a scanning electron microscope converging an electron beam on a sample, detecting a secondary signal generated from a surface of the sample, and observing an image of the surface of the sample of a sample chamber by using the electron beam apparatus.

In another general aspect, there is provided a transmission electron microscope receiving an enlarged image of a sample by a transmission electron beam through a screen on which an electron beam transmitting a sample of a sample chamber is enlarged and projected, by using the electron beam apparatus.

In another general aspect, there is provided an electron beam apparatus including a monochromator analyzing energy of an electron beam emitted from a sample and analyzing an element analysis chemical bonding state, a phonon state, and a plasmon state of the sample, by using the electron beam apparatus.

In another general aspect, there is provided an electron beam etching apparatus etching a surface of a sample within a sample chamber equipped with a gas introduction part by using the electron beam apparatus.

Advantageous Effects

The electron beam apparatus of the present invention has a monochromator having the high resolution and the excellent stability and maintainability by disposing the slit and the circular opening in one aperture part in parallel, thereby improving the spatial resolution and the energy resolution.

EMBODIMENTS

Hereinafter, embodiments of the present invention will be described in detail as follows with reference to the accompanying drawings so that they can be easily practiced by those skilled in the art to which the present invention pertains. Before detailed description of the present invention, it is to be noted that terms or words used in the present specification and claims to be described below should not be construed as being limited to a general meaning or dictionary definition. Therefore, the configurations described in the embodiments and drawings of the present invention are merely most embodiments but do not represent all of the technical spirits of the present invention. Thus, it is to be understood that the present invention may include various equivalents thereto, and modifications thereof at the time of filing this application.

Figure 1:
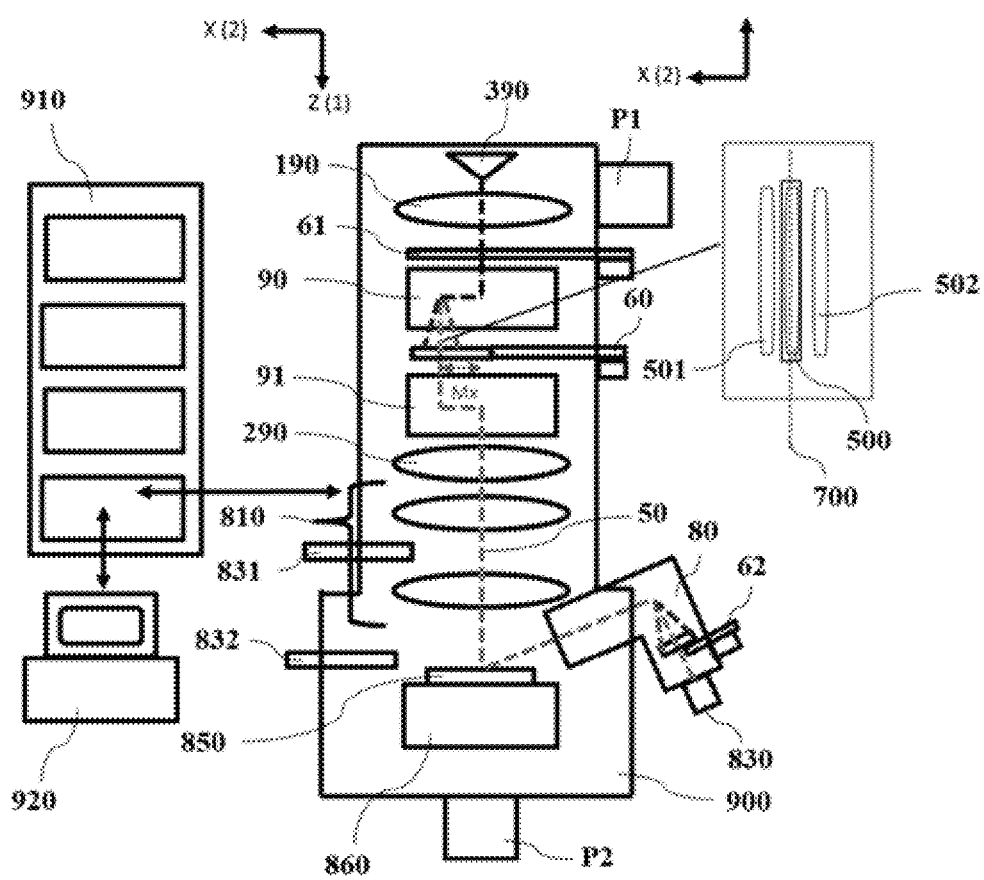
FIG. 1 is a conceptual diagram illustrating a system in which an electron beam apparatus including a monochromator is implemented in an EELS and an SEM, according to an embodiment of the present invention.

FIG. 1 is a conceptual diagram illustrating a system in which an electron beam apparatus including a monochromator is implemented in an electron energy loss spectroscopy (EELS) 80 and an SEM, according to an embodiment of the present invention. In the embodiment of the present invention, the electron beam apparatus including a monochromator includes an electron source 390, a first transmission lens 190 for focusing an electron beam emitted from the electron source, a monochromator limiting energy of the electron beam 50 passing through the first transmission lens to a predetermined range, a lens system 810, a second transmission lens 290 included in the lens system or further focusing the electron beam separately from the lens system, and detectors 831 and 832. The detectors 831 and 832 detect reflected electrons and secondary electrons scanned on and emitted to a sample 850 placed on a sample holder 860 in a vacuum sample chamber 900 after the electron source passes through a lens system. In one embodiment of the present invention, the monochromator includes an aperture part 60 that includes a plurality of rectangular energy selection slits 120 and 121, a plurality of dummy slits 20, and a plurality of circular slits 11 and a position adjustment part 861 for adjusting a position movement of an aperture to change the slits. In one embodiment of the present invention, the EELS 80 includes an aperture part 62 for EELS and an electron detector 830. In one embodiment of the present invention, the electron source, the vacuum sample chamber, and the lens system evacuate or maintain vacuum through vacuum pumps P1 and P2. The electron beam apparatus is controlled by an electrical control device 910 and a control computer 920.

In one embodiment of the present invention, the monochromator includes: a first electrode part 90 that is configured of a plurality of electrodes forming a plane xy perpendicular to an incident direction z of the electron beam, with the plurality of electrodes including a rectangular opening parallel to the incident direction z, and is configured so that electrons incident along a central axis $x_0 y_0$ of the incident direction z, by an effect of an electrostatic lens with an electric field formed by the rectangular opening when a voltage is applied to the electrodes, are deflected to different positions 501, 502, and 503 according to an energy distribution in a direction x of a short side of the rectangular opening of the electrodes, and are propagated in parallel to the incident direction; an aperture part 60 that includes a plurality of rectangular energy selection slits 503, 120, and 121 having the short side $S_x$ in the direction x, which is consistent with a deflected direction, of so as to selectively pass particles of the deflected and propagated electron beam belonging to a predetermined energy range E, E+ΔE therethrough at a predetermined deflection position range x, x+$S_x$, a plurality of dummy slits 20 for selecting a position, and a plurality of circular slits 11; and a position adjustment part 861 for adjusting a position movement of the slits according to energy of the deflected and propagated electron beam.

The first electrode part is configured of a plurality of electrodes in which the rectangular openings are arranged in a row, and when a long side of the rectangular opening is set as a y axis and a short side thereof is set as an x axis, the incident electron beam moves by a predetermined micro distance δx from an original point of the x axis and is incident on the original point where the y axis does not move. That is, the electron beam incident on the first electrode part is deflected and incident and is incident on a position deviating from the center of the potential formed by the opening to receive a deflection force in an x direction. At this point, since the electron beam moves in the x direction that is a direction of the short side of the rectangular opening, a trajectory of the electron beam is not changed in a y direction that is a direction of the long side thereof and changed in the x direction, such that a charged particle ray is separated by energy and propagated.

That is, the electron beam passing through the first electrode part which is configured of the plurality of electrodes in which the rectangular openings are arranged in parallel are separated into an electron beam 500 having central energy $E_0$, an electron beam 501 having energy of a value $E_0-\delta E$ smaller than the central energy, and an electron beam 502 having energy of a value $E_0+\delta E$ larger than the central energy and propagated. At this time, a slit 503 of the aperture part 60 is aligned (700) with the electron beam 500 having the central energy $E_0$ to selectively pass only the electron beam having uniform energy. The alignment is made by adjusting the position adjustment part 861 for adjusting the position movement of the slit.

Figure 2:
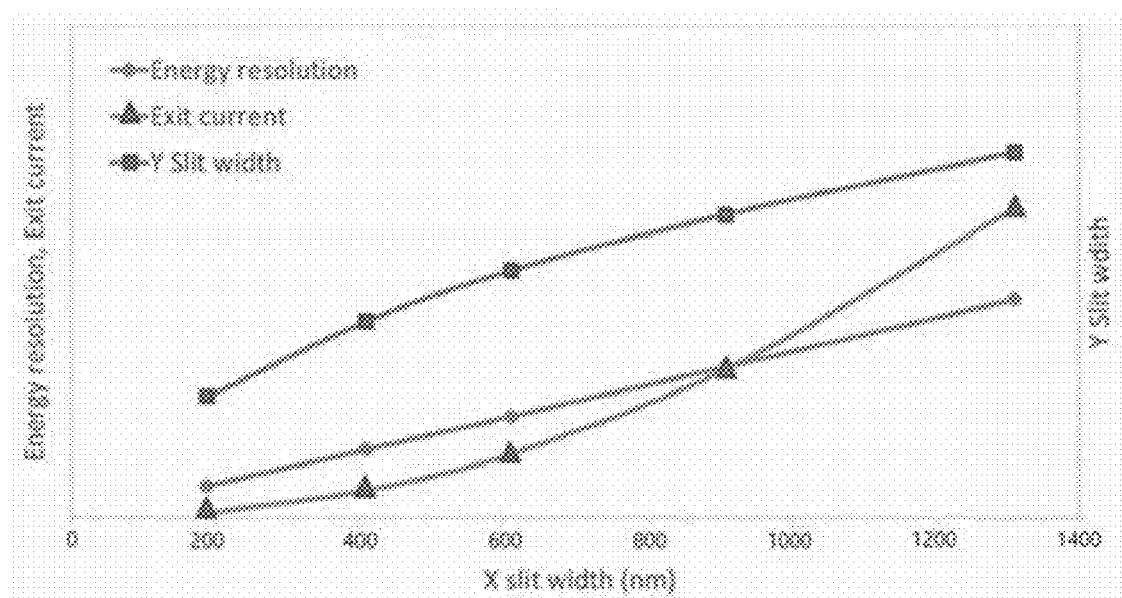
FIG. 2 is a graph illustrating the relationship of energy resolution according to a slit interval for showing that the narrower the slit width of the aperture part, the more precise the energy resolution may be obtained.

FIG. 2 is a graph illustrating the relationship of energy resolution according to a slit interval for showing that the narrower the slit width of the aperture part, the more precise the energy resolution may be obtained. As the slit width is narrow, the energy uniformity of the electron beam may be getting higher. In one embodiment of the present invention, in order to narrow the slit width of the aperture part, the slits are formed in thin film layers having a metal thin film that are formed on an upper surface 21 and a lower surface 22 of the central layer 23, in which a material of the central layer may be silicon nitride ($Si_3N_4$), carbon (C), platinum iridium (PtIr) and molybdenum (Mo), a thickness thereof may range from 20 nm to 500 μm, a material of the metal thin film may be platinum (Pt) or gold (Au) and a thickness thereof may range from 10 to 200 nm, a diameter of the circular slit 11 may range from 10 nm to 500 μm, a length of the short side $S_x$ of the rectangular slit may range from 50 nm to 100 μm, and a length of the long side $S_y$ thereof may range from 100 nm to 1000 μm.

Figure 3:
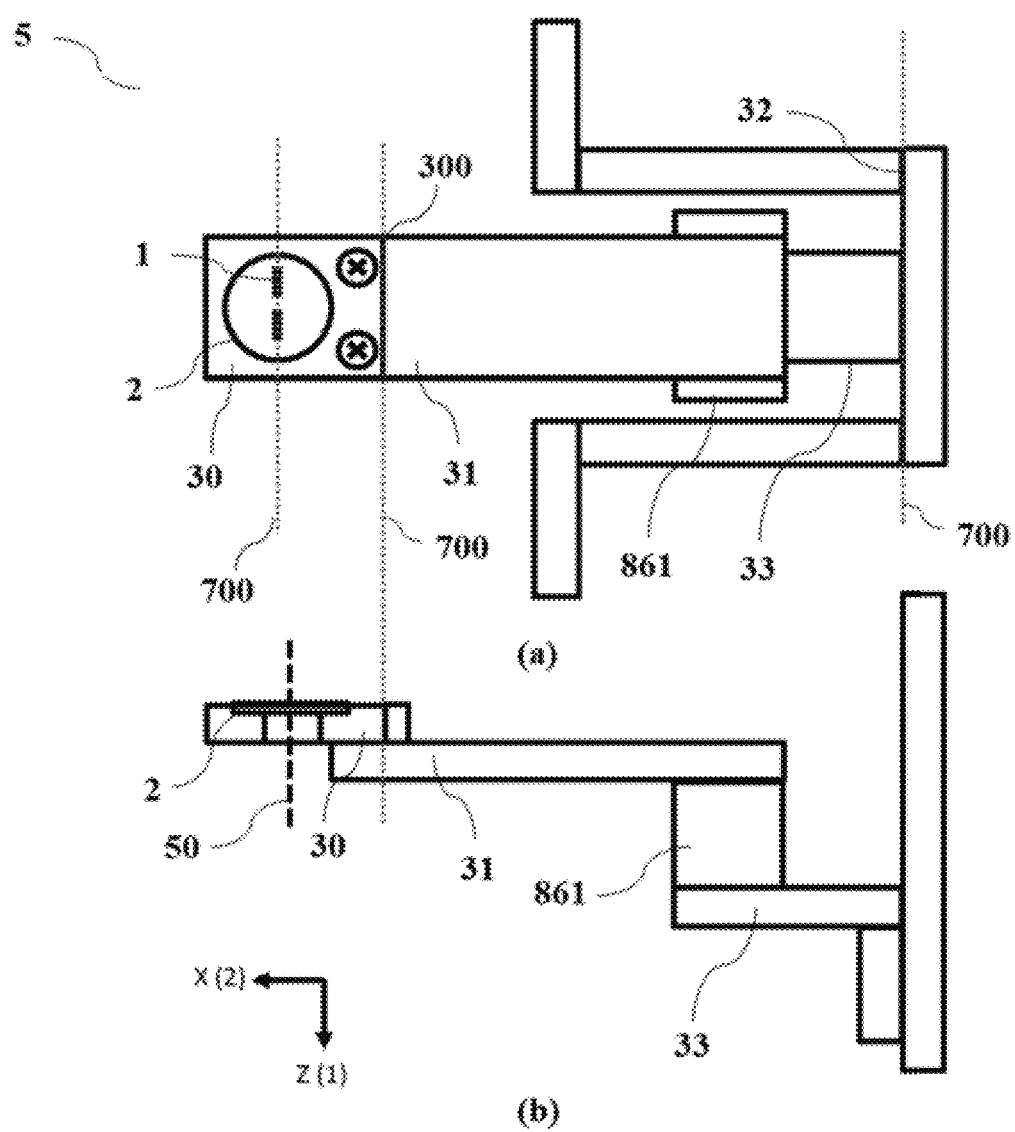
FIG. 3 shows (a) a plan view and (b) a cross-sectional view of an aperture part of a monochromator, according to one embodiment of the present invention.

FIG. 3 shows (a) a plan view and (b) a cross-sectional view of a connection structure 5 of the aperture part of the monochromator, according to one embodiment of the present invention. In one embodiment of the present invention, the aperture part includes a holder 30 for supporting the thin film layer; a support 31 for connecting the holder to the position adjustment part 861; and a base 33 for fixing the position adjustment part 861 to the aperture part attaching device, in which the position adjustment part 861 may move the slit in the deflected direction x or the perpendicular direction y to the deflected direction. In one embodiment of the present invention, the holder 30 is connected to a column of the electron beam apparatus by a column coupling part 32. Further, the holder 30 is fixed to the support 31 by a holder coupling part 300.

Figure 4:
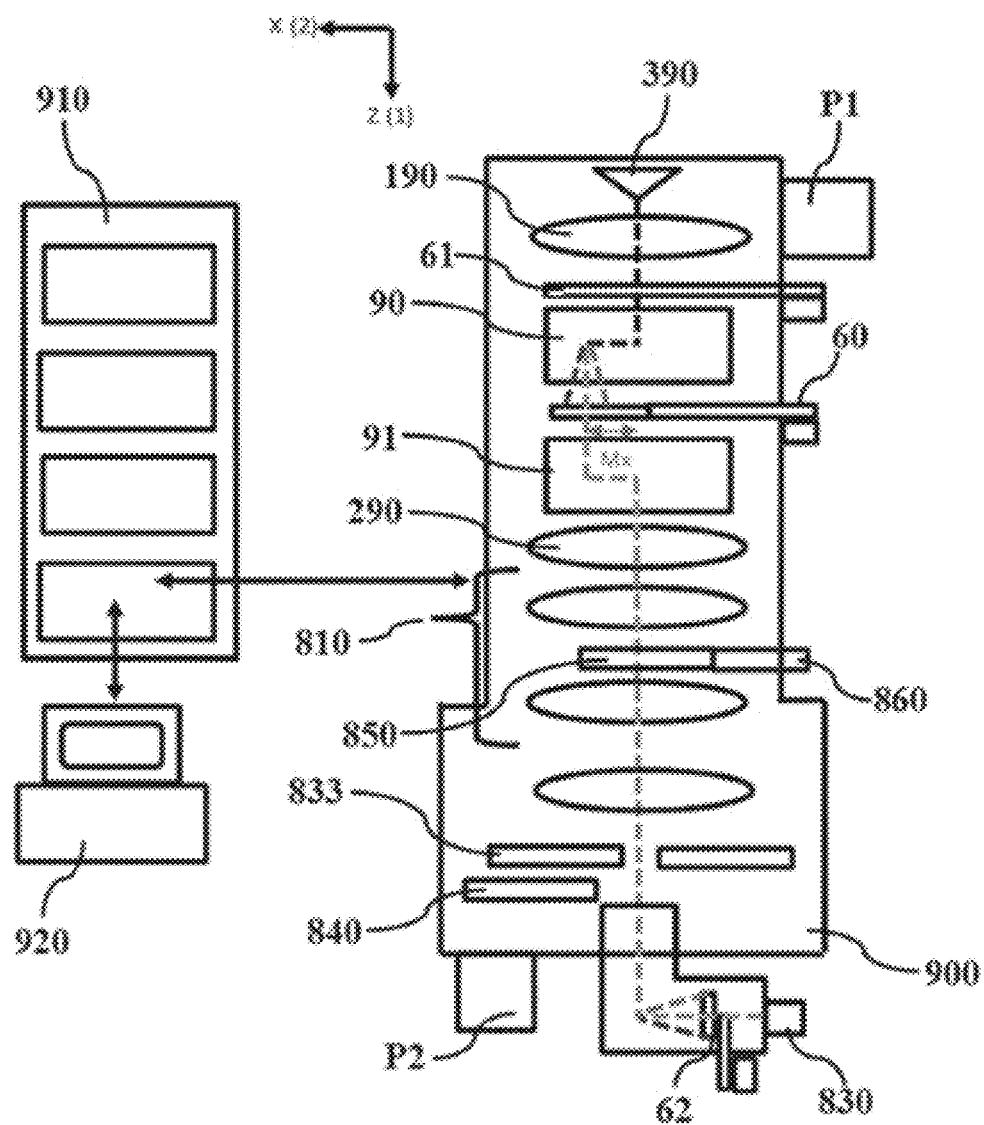
FIG. 4 is a conceptual diagram illustrating a system in which an electron beam apparatus including a monochromator is implemented in an EELS and a TEM, according to an embodiment of the present invention.

FIG. 4 is a conceptual diagram illustrating a system in which an electron beam apparatus including a monochromator is implemented in an EELS and a TEM, according to an embodiment of the present invention. In one embodiment of the present invention, the electron beam apparatus including a monochromator includes an electron source 390, a monochromator for limiting the energy of the electron beam 50 emitted from the electron source to a predetermined range, a lens system 810, and a detector 833 for scanning transmission electron microscopy (STEM), and a screen 834. After the electron source passes through the lens system, the transmission electrons transmitting through the sample 850 positioned in the sample holder 860 within the vacuum sample chamber are detected by the detector 833 for the STEM and/or the screen 834. In one embodiment of the present invention, the monochromator includes the aperture part 60 that includes the plurality of rectangular energy selection slits 120 and 121, the plurality of dummy slits 20, and the plurality of circular slits 11 and the position adjustment part 861 for adjusting the position movement of the aperture to change the slits. In one embodiment of the present invention, the EELS 80 includes the aperture part 62 for EELS and the electron detector 830. In one embodiment of the present invention, the electron source, the vacuum sample chamber, and the lens system evacuate or maintain vacuum through the vacuum pumps P1 and P2. The electron beam apparatus is controlled by the electrical control device 910 and the control computer 920.

Figure 5:
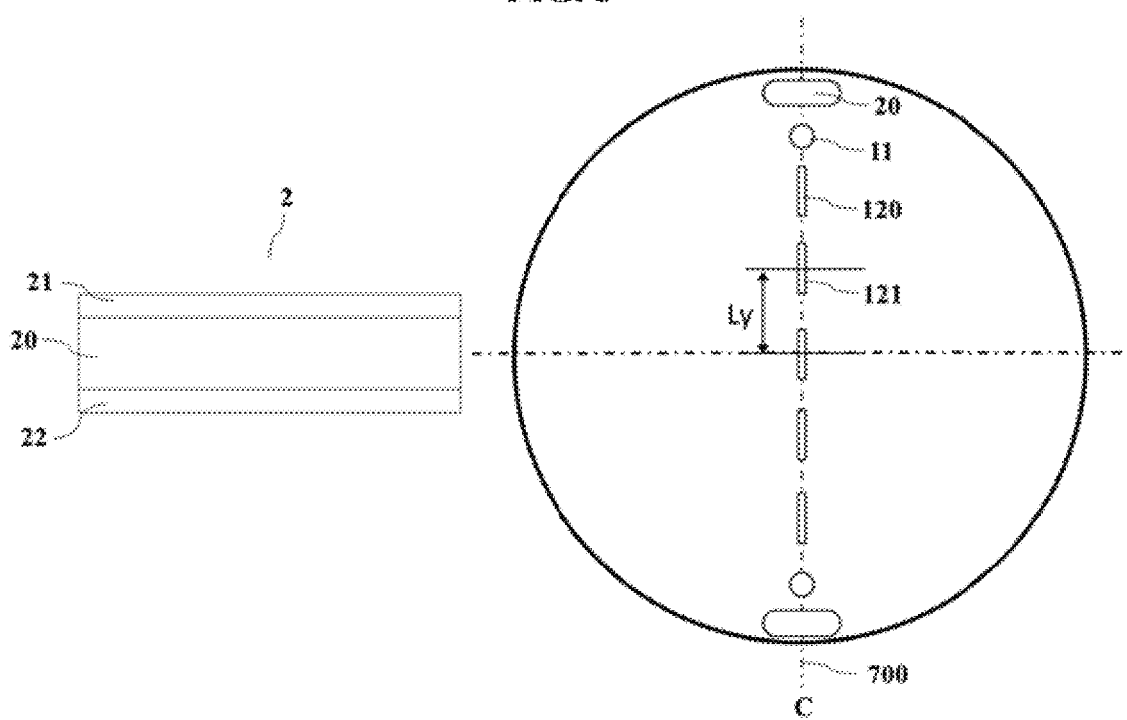
FIG. 5 is a conceptual diagram illustrating an arrangement of slits formed in an aperture part of a monochromator, according to an embodiment of the present invention
Figure 6:
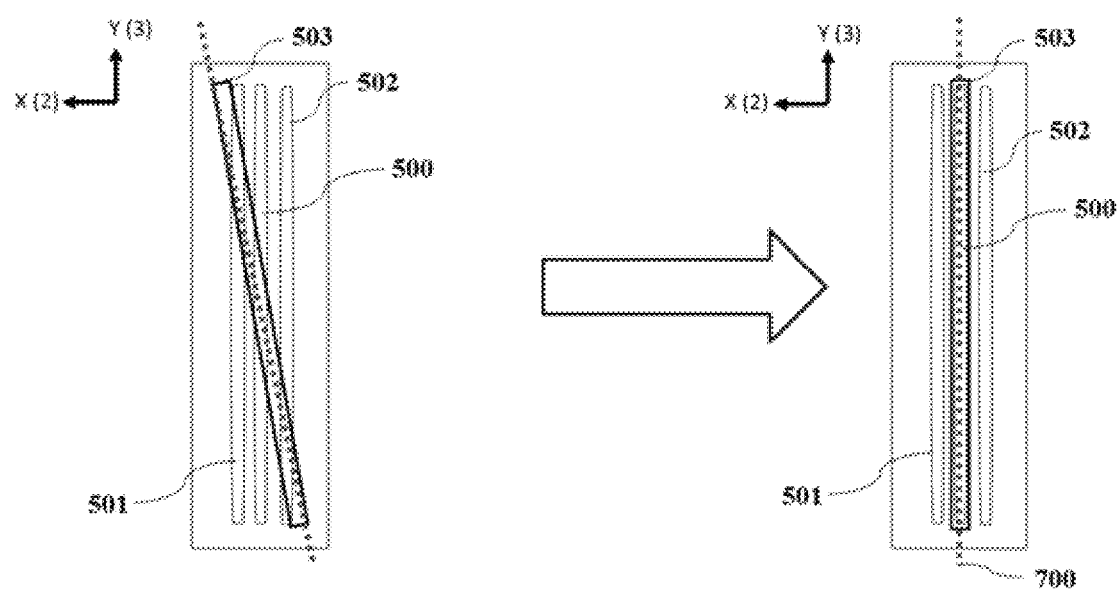
FIG. 6 is a conceptual diagram illustrating positioning of an energy selection slit according to a distribution direction of an electron beam, according to an embodiment of the present invention.

FIG. 5 is a conceptual diagram illustrating an arrangement of slits formed in a aperture part of a monochromator, according to an embodiment of the present invention and FIG. 6 is a conceptual diagram illustrating positioning of an energy selection slit according to a distribution direction of an electron beam, according to an embodiment of the present invention. Each connection surface of the holder 30, the support 31, the position adjustment part 861, and the base 33 according to the embodiment of the present invention has an angular range within 1° with respect to the long side direction of the rectangular hole of the first electrode part. That is, an error range of the long side direction angle of the slit and the first electrode part needs to be set within 1° by adjusting the holder, the support, the position adjustment part, and the base.

Figure 7:
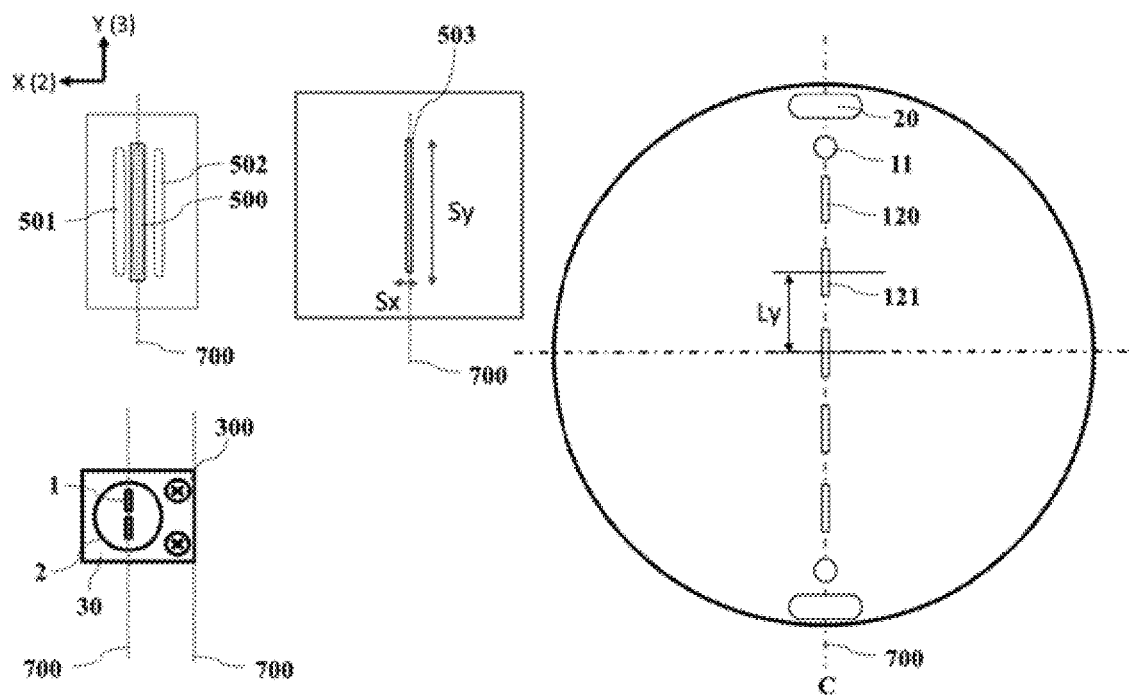
FIG. 7 is a conceptual diagram illustrating an electron beam energy distribution of an entrance aperture part and a monochromator aperture part having a slit, according to an embodiment of the present invention.

FIG. 7 is a conceptual diagram illustrating an electron beam energy distribution of an entrance aperture part and a monochromator aperture part having a slit, according to an embodiment of the present invention. FIG. 7 illustrates a form in which a plurality of slits are provided. The plurality of rectangular energy selection slits 120 and 121 according to one embodiment of the present invention may have the same size or different sizes and may preferably be arranged in parallel to be spaced apart from each other at a predetermined interval $L_y$ in the direction y of the long side $S_y$, orthogonal to the direction x of the short side $S_x$ that is the direction in which the electron beam is deflected. Further, the predetermined interval $L_y$ at which the plurality of rectangular energy selection slits are arranged along the direction y of the long side $S_y$ orthogonal to the direction x is preferably set to be larger than the diameter of the opening of the entrance aperture 61 through which the electron beam is incident on a central axis $x_0y_0$ so that the current distribution of the electron beam incident on the first electrode part is limited to a predetermined size.

Figure 8:
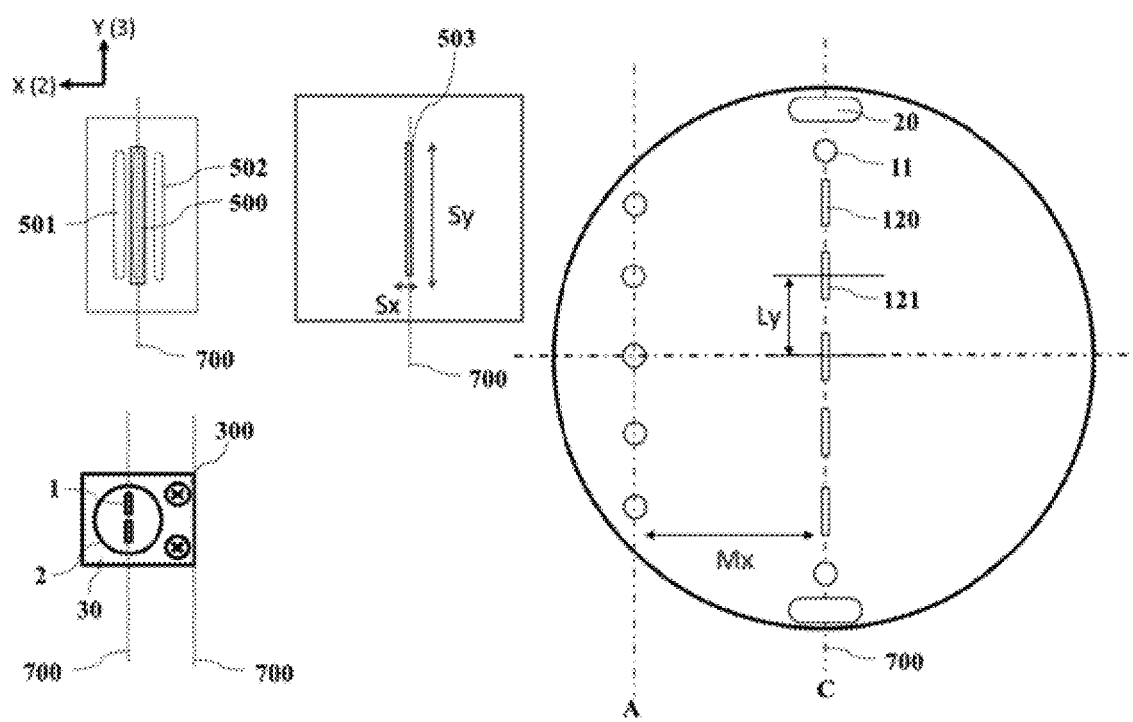
FIG. 8 is a conceptual diagram illustrating the electron beam energy distribution of the entrance aperture part and a monochromator aperture part in which a circular slit and an energy selection slit are each arranged in a row, according to an embodiment of the present invention.

FIG. 8 is a conceptual diagram illustrating the electron beam energy distribution of the entrance aperture part and a monochromator aperture part in which a circular slit and an energy selection slit are each arranged in a row, according to an embodiment of the present invention. The plurality of circular slits 11 according to the embodiment of the present invention may have the same size or different sizes and the plurality of circular slits 11 may be arranged in parallel to be spaced apart from each other by a predetermined distance $M_x$ in the direction x of the short side $S_x$, which is the deflected direction, from the plurality of rectangular slits 120 and 121. The plurality of circular slits 11 according to another embodiment of the present invention are arranged at a position coinciding with the central axis $x_0$ in the incident direction. In one embodiment of the present invention, when the electron beam apparatus is not limited to the energy range E, E+ΔE, it makes the voltage applied to the first electrode part OFF to straighten the electron beam without deflecting the electron beam, and therefore the electron beam is irradiated to the sample using one of the plurality of circular slits 11 that are placed at a position coinciding with the extending line of the central axis $x_0$ of the incident direction.

Figure 9:
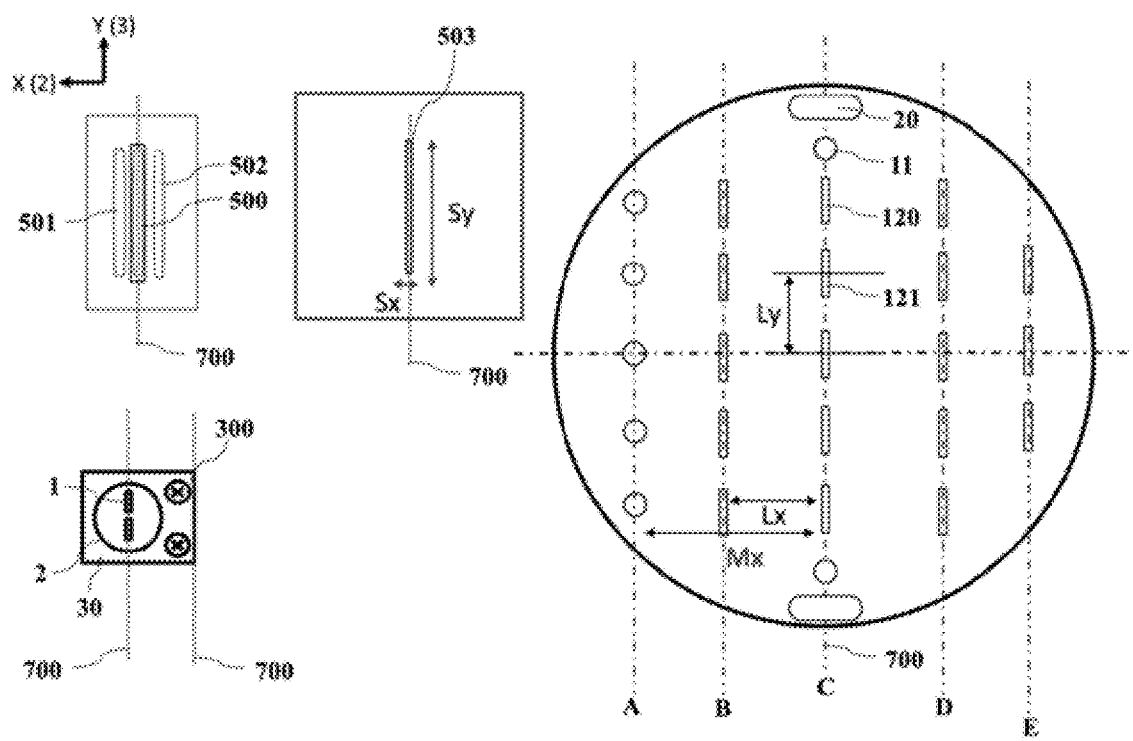
FIG. 9 is a conceptual diagram illustrating the electron beam energy distribution of the entrance aperture part and the monochromator aperture part in which the circular slit in a row and the energy selection slits configured in a plurality of rows are arranged side by side, according to an embodiment of the present invention.
Figure 10:
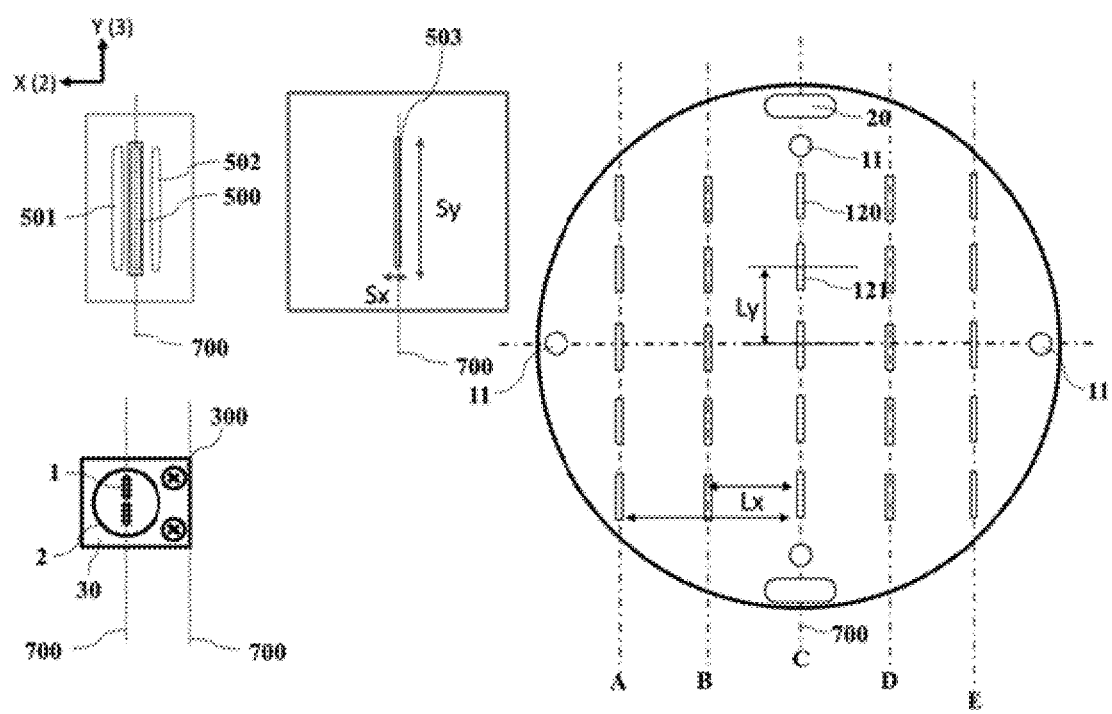
FIG. 10 is a conceptual diagram illustrating the electron beam energy distribution of the entrance aperture part and the monochromator aperture part in which a plurality of circular slits and the energy selection slits configured in a plurality of rows are arranged side by side, according to an embodiment of the present invention.

FIG. 9 is a conceptual diagram illustrating the electron beam energy distribution of the entrance aperture part and the monochromator aperture part in which the circular slit in a row and the energy selection slits configured in a plurality of rows are arranged side by side, according to an embodiment of the present invention and FIG. 10 is a conceptual diagram illustrating the electron beam energy distribution of the entrance aperture part and the monochromator aperture part in which a plurality of circular slits and the energy selection slits configured in a plurality of rows are arranged side by side, according to an embodiment of the present invention. In one embodiment of the present invention, the plurality of rectangular energy selection slits 120 and 121 have the same size and are arranged at the predetermined intervals $L_x$ and $L_y$ along the direction x of the short side $S_x$ that is the direction in which the electron beam is deflected, and the direction y orthogonal to the deflected direction, in which the predetermined interval $L_y$ at which the plurality of rectangular energy selection slits 120 and 121 are arranged along the orthogonal direction y is larger than the diameter of the opening of the entrance aperture through which the electron beam is incident on the central axis $x_0y_0$ so that the current distribution of the incident electron beam is limited to the predetermined size. In another embodiment of the present invention, the plurality of rectangular energy selection slits 120 and 121 include the same size and different sizes, and the plurality of slits having the same size are arranged at the predetermined interval $L_x$ along the direction x of the short side $S_x$ that is the direction in which the electron beam is deflected, the plurality of slits having different sizes are arranged at the predetermined interval $L_y$ along the direction y orthogonal to the deflected direction x, and the predetermined interval $L_y$ at which the plurality of rectangular energy selection slits 120 and 121 are arranged along the orthogonal direction y is larger than the diameter of the opening of the entrance aperture 61 through which the electron beam is incident on the central axis $x_0y_0$ so that the current distribution of the incident electron beam is limited to the predetermined size.

In one embodiment of the present invention, the dummy slits are positioned, one by one, at each of both edges of the direction y orthogonal to the direction x of the short side $S_x$ that is the deflected direction from the central position of the direction x of the short side $S_x$. In another embodiment of the present invention, the plurality of circular slits 11 are the same size or different sizes, and the circular slits 11 are arranged along the direction y orthogonal to the direction x of the short side $S_x$ that is the deflected direction or are arranged at both edges of the orthogonal direction y. Further, when the electron beam apparatus according to the present invention is not limited to the energy range E, E+ΔE, it makes the voltage applied to the first electrode part OFF to straighten the electron beam without deflecting the electron beam, and therefore the electron beam is irradiated to the sample using one of the plurality of circular slits 11 that are placed at a position coinciding with the extending line of the central axis $x_0$ of the incident direction. Further, the direction of the long side of the rectangular energy selection slit 503 is aligned so that the angle range deviating from the direction of the long side of the rectangular opening of the first electrode part is within 1°.

Figure 11:
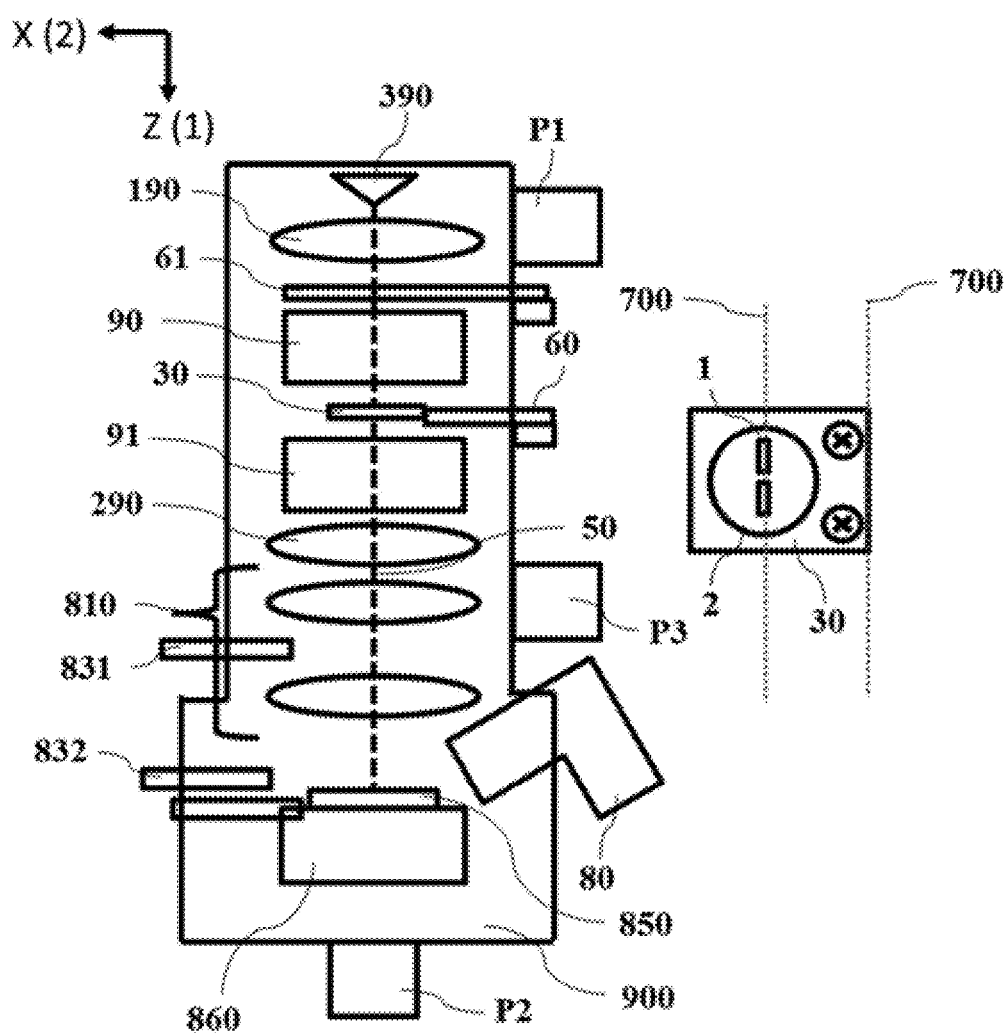
FIG. 11 is a conceptual diagram illustrating the monochromator aperture part in the state in which the energy selection slit is now aligned at a center of the electron beam passing through a first electrode part in the electron beam apparatus including a monochromator, according to an embodiment of the present invention.

FIG. 11 is a conceptual diagram illustrating the monochromator aperture part in the state in which the energy selection slit is now aligned at the center of the electron beam passing through the first electrode part in the electron beam apparatus including a monochromator, according to an embodiment of the present invention. In an embodiment of the present invention, the electron beam apparatus may include a second electrode part 91 that is disposed at a rear end of the aperture part and generate an electric field to deflect the electron beam passing through the energy selection slit to the central axis $x_0y_0$ of the incident direction that is the original position when a voltage is applied to the second electrode part 91 configured of the plurality of electrodes including the opening formed in parallel to the incident direction z of the electron beam passing through the energy selection slit, in which the position of the second electrode part is symmetrical to the first electrode part with respect to the aperture.

Figure 12:
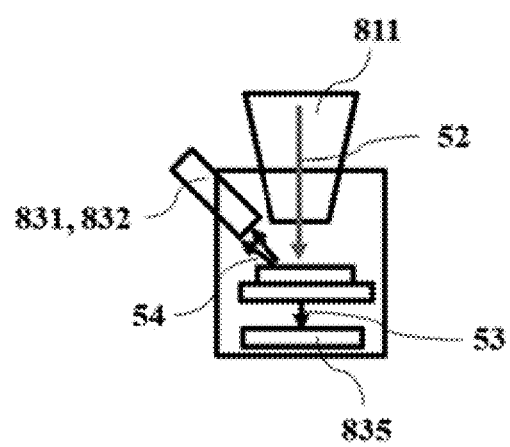
FIG. 12 is a conceptual diagram illustrating a sample observation region of the electron beam apparatus including a monochromator implemented by the SEM and the TEM, according to an embodiment of the present invention.

FIG. 12 is a conceptual diagram illustrating a sample observation region of the electron beam apparatus having the monochromator implemented by the SEM and the TEM, according to an embodiment of the present invention. An electron microscope of the present invention allows a sample incident electron beam 52 to be incident on a sample from the optical system 811 of the electron beam apparatus. In the case of the SEM, the secondary electron detector 833 detects the secondary electrons 54 emitted from the sample of the sample chamber by the operation of the incident electron beam and in the case of the TEM, the screen 835 that enlarges and projects the electron beam 53 transmitting the sample in the sample chamber observes an enlarged image.

The electron beam apparatus including a monochromator according to the embodiment of the present invention may be used as an electron beam loss spectroscope. Further, it is possible to analyze the energy of the electron beam emitted from the sample using the electron beam apparatus including a monochromator according to an embodiment of the present invention and to analyze an element analysis chemical bonding state, phonon state, and plasmon state of the sample. The electron beam apparatus including a monochromator according to another embodiment of the present invention may function as an electron beam etching apparatus for etching a surface of a sample by introducing a gas introducing part into a sample chamber.

Hereinabove, although the embodiments of the present invention have been described in detail, the scope of the present invention is not limited thereto, but modifications and alterations made by those skilled in the art using the basic concept of the present invention defined in the following claims fall within the scope of the present invention.

All technical terms used in the present invention are used as a meaning generally understood by a person having ordinary knowledge in the art to which the present invention pertains, unless defined otherwise. Contents of all publications described in the present specification as reference documents are introduced into the present invention.

DETAILED DESCRIPTION OF MAIN ELEMENTS

1. Slit of aperture part
2. Cross section of coating layer of aperture part
5. Connection structure of aperture part
11. Circular slit
20. Dummy slit
21. Metal thin film on upper surface of slit
22. Metal thin film on lower surface of slit
23. Central layer of slit
30. Holder
31. Support
32. Coupling part
33. Base
50. Electron beam
52. Sample incident electron beam
53. Sample transmitting electron beam
54. Secondary electron
60. Aperture part
61. Entrance aperture
62. Aperture part for EELS
80. Electron energy loss spectroscopy (EELS)
90. First electrode part
91. Second electrode part
120, 121. Rectangular energy selection slit
190. First transmission lens
290. Second transmission lens
300. Holder coupling part
301. Holder guide
390. Electron source
500. Electron beam having energy $E_0$
501. Electron beam having energy $E_0-\delta E$
502. Electron beam having energy $E_0+\delta E$
503. Energy selection slit of aperture part
700. Display equilibrium state
810. Lens system
811. Optical system
830. Electron detector
831, 832. Detector
833. Detector for scanning transmission electron microscope
840. Detector for TEM
850. Sample
860. Sample holder
861. Position adjustment part
900. Vacuum sample chamber
910. Electrical control device
920. Control computer
P1, P2. Vacuum pump

The invention claimed is:

1. An electron beam apparatus including a monochromator, comprising:
    an electron source, the monochromator limiting energy of an electron beam emitted from the electron source to a predetermined range, a lens system, and a detector,
    wherein the monochromator includes an aperture part that includes a plurality of rectangular energy selection slits, a plurality of dummy slits, and a plurality of circular slits,
    wherein the monochromator includes:
        a first electrode part that comprises a plurality of electrodes forming a plane xy perpendicular to an incident direction z of the electron beam, with the plurality of electrodes including a rectangular opening parallel to the incident direction z, and is configured so that electrons traveling along a central axis of the incident direction z, are deflected by an effect of an electrostatic lens with an electric field formed by the rectangular opening when a voltage is applied to the electrodes, to different positions based on an energy distribution in a direction x of a short side of the rectangular opening of the electrodes, and are propagated in parallel to the incident direction;
        the aperture part that includes the plurality of rectangular energy selection slits having the short side in the direction x, which is consistent with a deflected direction, so as to selectively pass particles of the deflected and propagated electron beam belonging to a predetermined energy range therethrough at a predetermined deflection position range, and the plurality of dummy slits for selecting a position; and
    wherein the aperture part is configured to move for adjusting a position of the slits of the aperture part based on energy of the deflected and propagated electron beam.

2. The electron beam apparatus including a monochromator of claim 1, wherein the slits of the aperture part are formed in thin film layers having a metal thin film that are formed on an upper surface and a lower surface of the central layer,
    a material of the central layer is silicon nitride ($Si_3N_4$), carbon (C), platinum iridium (PtIr), and molybdenum (Mo) and a thickness thereof ranges from 20 nm to 500 µm,
    a material of the metal thin film is platinum (Pt) or gold (Au) and a thickness thereof ranges from 10 to 200 nm,
    a diameter of the circular slit ranges from 10 nm to 500 µm, and
    a length of the short side of the rectangular energy selection slit ranges from 50 nm to 100 µm and a length of the long side thereof ranges from 100 nm to 1000 µm.

3. The electron beam apparatus including a monochromator of claim 2, wherein the aperture part includes:
    a holder for supporting the thin film layer;
    a support coupled to the holder; and
    a base coupled to to the aperture part,
    wherein the aperture part is configured to move in the deflected direction x or the perpendicular direction y to the deflected direction.

4. The electron beam apparatus including a monochromator of claim 3, wherein each connection surface of the holder, the support, and the base has an angular range within 1° with respect to the long side direction of the rectangular opening of the first electrode part.

5. The electron beam apparatus including a monochromator of claim 1, wherein the plurality of rectangular energy selection slits have the same size or different sizes and are arranged to be spaced apart from each other at a predetermined interval in the direction y of the long side orthogonal to the direction x of the short side that is the direction in which the electron beam is deflected.

6. The electron beam apparatus including a monochromator of claim 5, wherein the predetermined interval at which the plurality of rectangular energy selection slits are arranged along the direction y of the long side orthogonal to the direction x is set to be larger than the diameter of an opening of an entrance aperture through which the electron beam is incident on a central axis so that a current distribution of the electron beam incident on the first electrode part is limited to a predetermined size.

7. The electron beam apparatus including a monochromator of claim 5, wherein the plurality of circular slits have the same size or different sizes and the plurality of circular slits are arranged in parallel to be spaced apart from each other by a predetermined distance in the direction x of the short side, which is the deflected direction, from the plurality of rectangular energy selection slits.

8. The electron beam apparatus including a monochromator of claim 5, wherein the plurality of circular slits are arranged at a position coinciding with the central axis in the incident direction.

9. The electron beam apparatus including a monochromator of claim 7, wherein when the monochromator is not limited to the energy range, the electron beam apparatus makes the voltage applied to the first electrode part OFF to straighten the electron beam without deflecting the electron beam, and therefore the electron beam is irradiated to a sample using one of the plurality of circular slits that are placed at the position coinciding with the extending line of the central axis of the incident direction.

10. The electron beam apparatus including a monochromator of claim 1, wherein the plurality of rectangular energy selection slits have the same size and are arranged at the predetermined intervals along the direction x of the short side that is the direction in which the electron beam is deflected and the direction y orthogonal to the deflected direction, and the predetermined interval at which the plurality of rectangular energy selection slits are arranged along the orthogonal direction y is larger than the diameter of an opening of an entrance aperture through which the electron beam is incident on the central axis so that the current distribution of the incident electron beam is limited to the predetermined size.

11. The electron beam apparatus including a monochromator of claim 1, wherein the plurality of rectangular energy selection slits include the same size and different sizes, and the plurality of slits having the same size are arranged at the predetermined interval along the direction x of the short side that is the direction in which the electron beam is deflected, the plurality of slits having different sizes are arranged at the predetermined interval along the direction y orthogonal to the deflected direction x, and the predetermined interval at which the plurality of rectangular energy selection slits are arranged along the orthogonal direction y is larger than the diameter of an opening of an entrance aperture through which the electron beam is incident on the central axis so that the current distribution of the incident electron beam is limited to the predetermined size.

12. The electron beam apparatus including a monochromator of claim 1, wherein the number of the dummy slits is two and the dummy slits are positioned, one by one, at each of both edges of the direction y orthogonal to the direction x of the short side that is the deflected direction from the central position of the direction x of the short side.

13. The electron beam apparatus including a monochromator of claim 1, wherein the plurality of circular slits are the same size or different sizes, and the circular slits are arranged along the direction y orthogonal to the direction x of the short side that is the deflected direction or are arranged at both edges of the orthogonal direction y.

14. The electron beam apparatus including a monochromator of claim 13, wherein when the monochromator is not limited to the energy range, the electron beam apparatus makes the voltage applied to the first electrode part OFF to straighten the electron beam without deflecting the electron beam, and therefore the electron beam is irradiated to the sample using one of the plurality of circular slits that are placed at a position coinciding with the extending line of the central axis of the incident direction.

15. The electron beam apparatus including a monochromator of claim 1, wherein the direction of the long side of the rectangular energy selection slit of the aperture part is aligned so that an angle range deviating from the direction of the long side of the rectangular opening of the first electrode part is within 1°.

* * * * *